(12) United States Patent
Ueda

(10) Patent No.: US 8,014,219 B2
(45) Date of Patent: Sep. 6, 2011

(54) SEMICONDUCTOR MEMORY DEVICE

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 179 days.

(21) Appl. No.: 12/552,219

(22) Filed: Sep. 1, 2009

(65) Prior Publication Data

US 2010/0054020 A1      Mar. 4, 2010

(30) Foreign Application Priority Data

Sep. 4, 2008   (JP) ................................. 2008-226903

(51) Int. Cl.
*G11C 7/00*      (2006.01)

(52) U.S. Cl. ............... 365/189.15; 365/189.14; 365/210
(58) Field of Classification Search ............. 365/189.15, 365/189.14, 210
See application file for complete search history.

(56) References Cited

U.S. PATENT DOCUMENTS 5,258,958 A *  11/1993  Iwahashi et al. .......... 365/185.21
2008/0175075 A1 *  7/2008  La Rosa ................... 365/189.15

FOREIGN PATENT DOCUMENTS

JP      2003-297072 A      10/2003

OTHER PUBLICATIONS

Explanation of Non-English Language Reference.

* cited by examiner

*Primary Examiner* — Son T Dinh
(74) *Attorney, Agent, or Firm* — Knobbe, Martens, Olson & Bear LLP

(57) ABSTRACT

A semiconductor memory device includes a memory cell having a resistance which differs based on stored data, a bit line connected to the memory cell, a first MOSFET which clamps the bit line to a read voltage when reading data, a sense amplifier which detects the stored data in the memory cell based on a current flowing through the bit line, a first switch element which connects the sense amplifier to a drain of the first MOSFET, a second switch element which connects a source of the first MOSFET to the bit line, a third switch element which connects the drain of the first MOSFET to a ground terminal, and a fourth switch element which connects the source of the first MOSFET to a ground terminal.

20 Claims, 9 Drawing Sheets

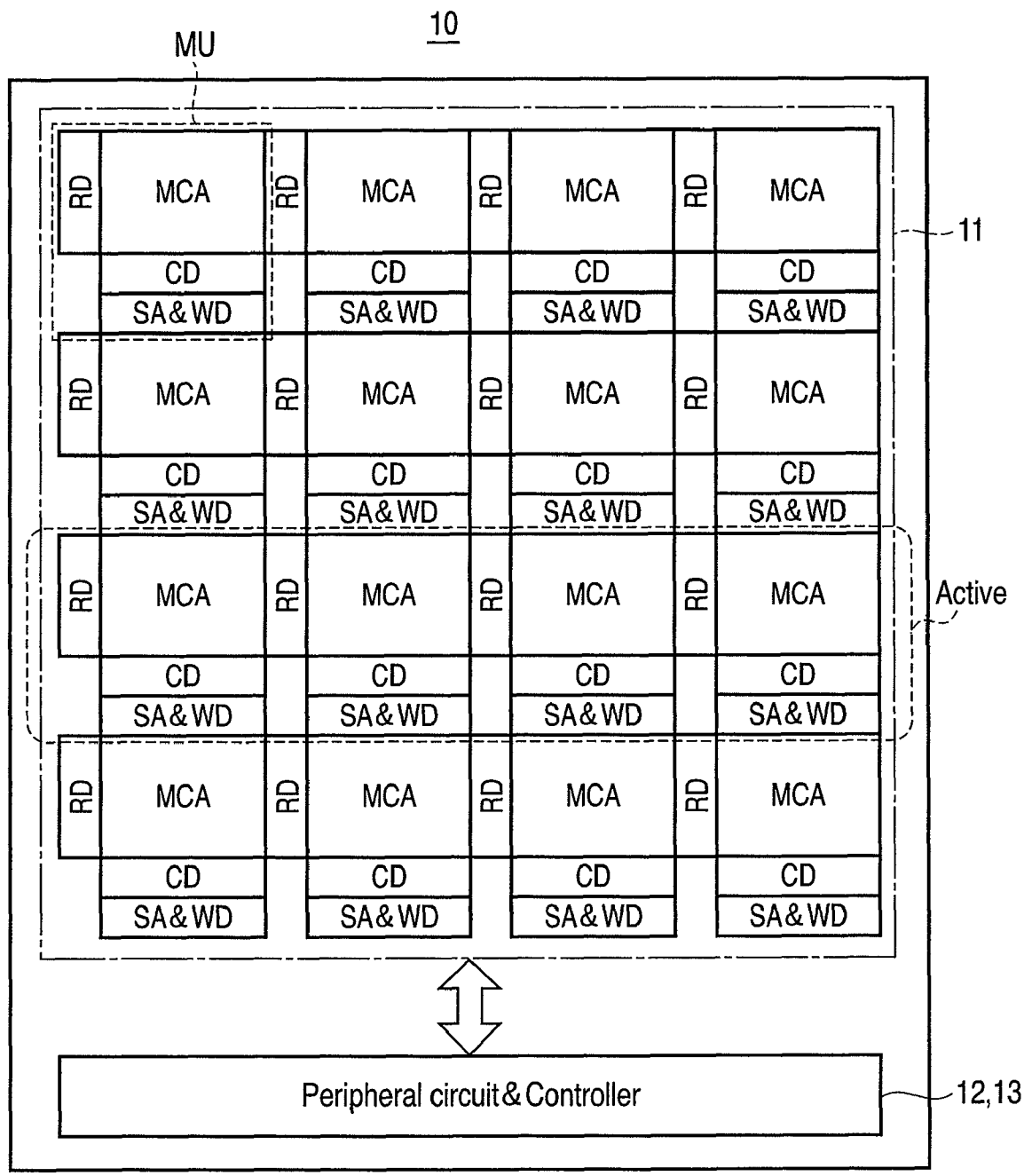
F I G. 1

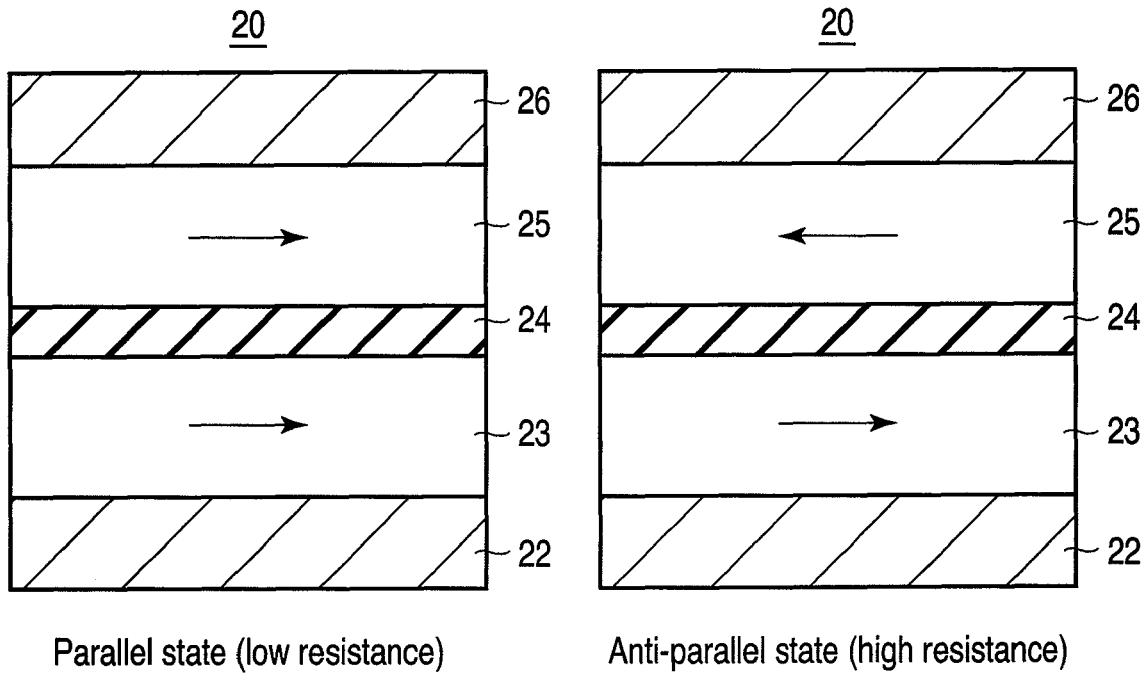
Parallel state (low resistance)    Anti-parallel state (high resistance)
F I G. 5A    F I G. 5B
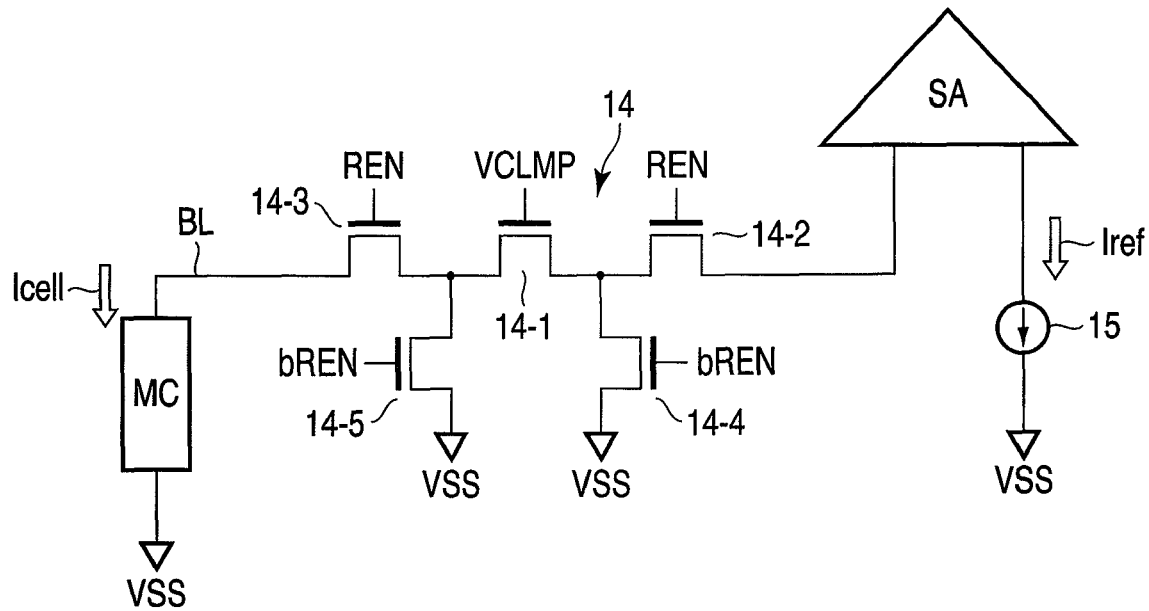
F I G. 6

|  | REN | bREN |
|---|---|---|
| Active | H | L |
| Inactive | L | H |

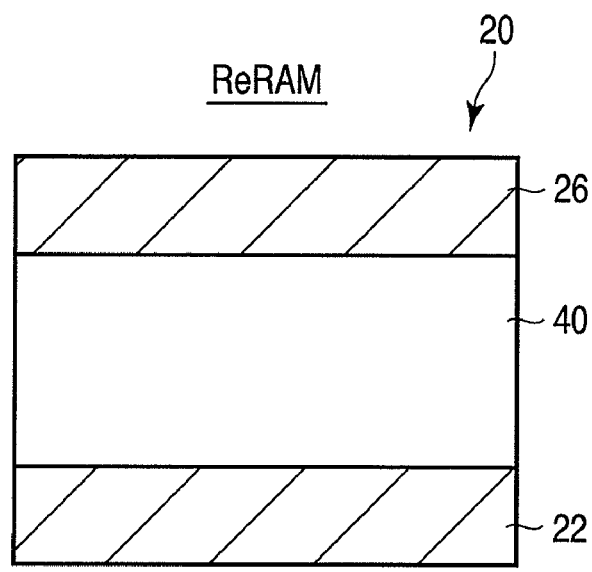
F I G. 13
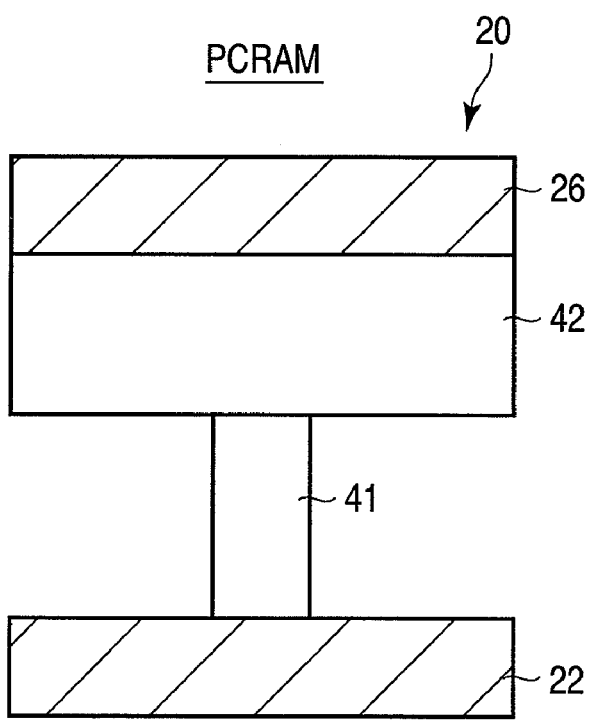
F I G. 14

SEMICONDUCTOR MEMORY DEVICE

CROSS-REFERENCE TO RELATED APPLICATIONS

This application is based upon and claims the benefit of priority from prior Japanese Patent Application No. 2008-226903, filed Sep. 4, 2008, 2005, the entire contents of which are incorporated herein by reference.

BACKGROUND OF THE INVENTION

1. Field of the Invention

The present invention relates to a semiconductor memory device, and more particularly to, e.g., a semiconductor memory device including a variable-resistance element whose resistance varies based on stored data.

2. Description of the Related Art

As a memory using a variable-resistance element, for example, a magnetic random access memory (MRAM), phase-change random access memory (PCRAM), or resistive random access memory (ReRAM) is known. A memory cell used in each of these memories has a configuration where one variable-resistance element and one select transistor are connected in series, for example. Further, a bit line is connected to the other end of the variable-resistance element, a word line is connected to a gate of the select transistor, and a ground terminal is connected to the other end of the select transistor.

When reading data stored in this memory cell, a read voltage is applied to the memory cell, for example. Furthermore, the resistance state of the memory cell is determined to read the data by using a sense amplifier to compare a read current flowing through the memory cell with a reference current. Here, in order to perform accurate reading, the read voltage must be kept constant even when there is power supply noise.

Moreover, as this type of relevant technology, a technology that uses a dummy cell to generate a reference current which is utilized when reading data is suggested (JP-A 2003-297072 [KOKAI]).

BRIEF SUMMARY OF THE INVENTION

According to an aspect of the present invention, there is provided a semiconductor memory device comprising: a memory cell having a resistance which differs based on stored data; a bit line connected to the memory cell; a first MOSFET which clamps the bit line to a read voltage when reading data; a sense amplifier which detects the stored data in the memory cell based on a current flowing through the bit line; a first switch element which connects the sense amplifier to a drain of the first MOSFET; a second switch element which connects a source of the first MOSFET to the bit line; a third switch element which connects the drain of the first MOSFET to a ground terminal; and a fourth switch element which connects the source of the first MOSFET to a ground terminal. The first and second switch elements are on and the third and fourth switch elements are off when the sense amplifier is active, and the first and second switch elements are off and the third and fourth switch elements are on when the sense amplifier is inactive.

According to an aspect of the present invention, there is provided a semiconductor memory device comprising: a memory cell having a resistance which differs based on stored data; a bit line connected to the memory cell; a first MOSFET which clamps the bit line to a read voltage when reading data; a sense amplifier which detects the stored data in the memory cell based on a current flowing through the bit line; a second MOSFET which connects the sense amplifier to a drain of the first MOSFET; a third MOSFET which connects a source of the first MOSFET to the bit line; a fourth MOSFET which connects the drain of the first MOSFET to a ground terminal; and a fifth MOSFET which connects the source of the first MOSFET to a ground terminal. The second and third MOSFETs are on and the fourth and fifth MOSFETs are off when the sense amplifier is active, and the second and third MOSFETs are off and the fourth and fifth MOSFETs are on when the sense amplifier is inactive.

BRIEF DESCRIPTION OF THE SEVERAL VIEWS OF THE DRAWING

FIG. 1 is a schematic view showing a configuration of a resistance-change memory 10 according to a first embodiment of the present invention;

FIGS. 5A and 5B are views showing a low-resistance state and a high-resistance state of the MTJ element 20;

FIG. 6 is a circuit diagram showing a configuration of a voltage clamp circuit 14;

FIG. 13 is a schematic view showing a configuration of a variable-resistance element 20 used in an ReRAM; and FIG. 14 is a schematic view showing a configuration of a variable-resistance element 20 used in a PCRAM.

DETAILED DESCRIPTION OF THE INVENTION

Figure 2:
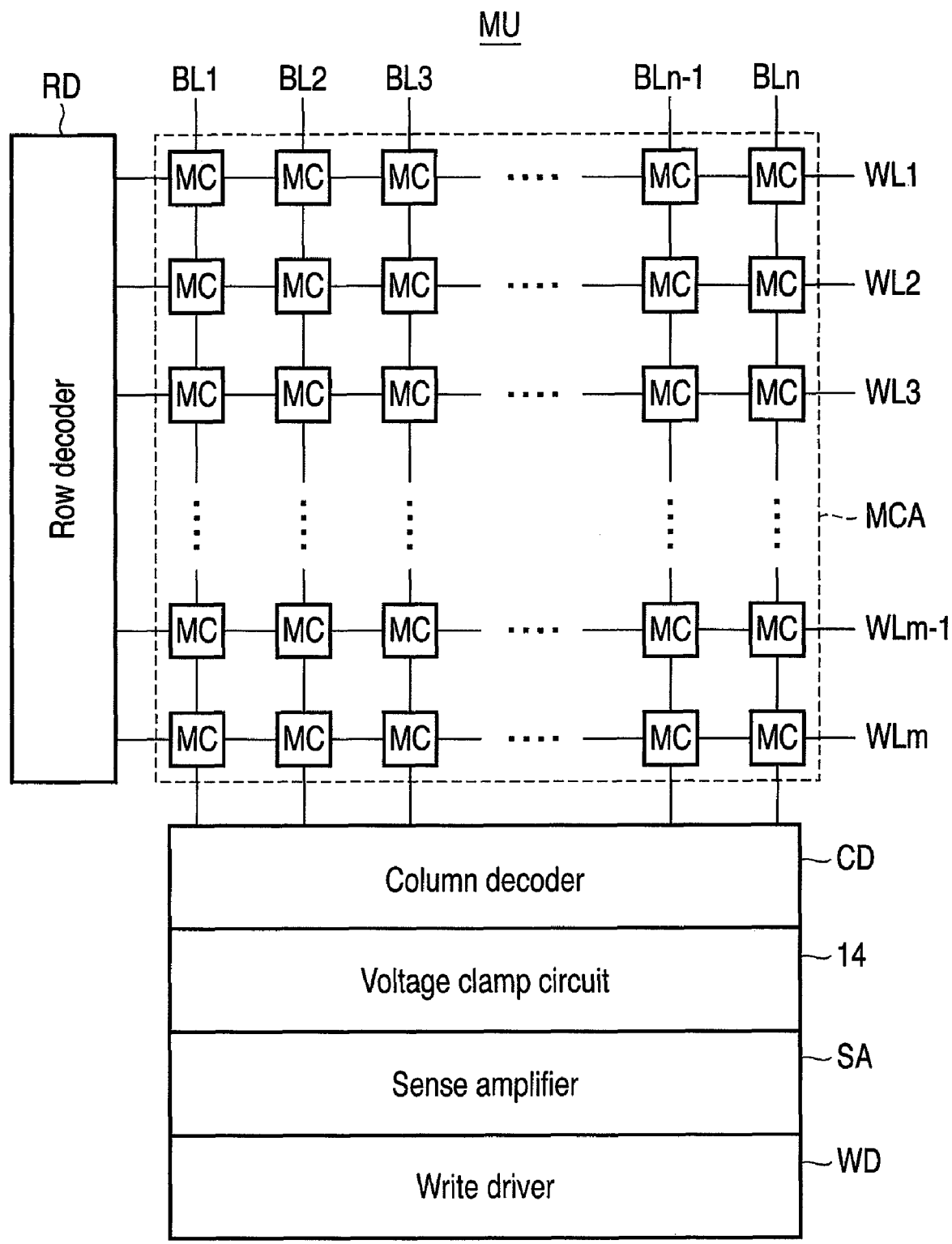
FIG. 2 is a block diagram showing a configuration of one memory unit MU.

The embodiments of the present invention will be described hereinafter with reference to the accompanying drawings. In the description which follows, the same or functionally equivalent elements are denoted by the same reference numerals, to thereby simplify the description.

First Embodiment

FIG. 1 is a schematic view showing a configuration of a resistance-change memory 10 according to a first embodiment of the present invention. The resistance-change memory 10 includes a memory core 11, a peripheral circuit 12, and a controller 13. The peripheral circuit 12 executes operations such as supply of an address, supply of various kinds of voltages, input/output of data with respect to the memory core 11. The controller 13 supplies various kinds of control signals required for, e.g., a data write operation and a data read operation to the memory core 11 to control operations of the memory core 11.

The memory core 11 is configured by arranging a plurality of memory units MU in a matrix. Each memory unit MU includes a memory cell array MCA, a row decoder RD, a column decoder CD, a sense amplifier SA, a write driver WD, and others. A specific configuration of the memory unit MU will be described later.

The number of the memory units MU included in the memory core 11 is not restricted in particular, and the (4×4) memory units MU are shown in FIG. 1, for example. The number of columns in the memory core 11 is associated with the number of inputs/outputs (I/O) of the resistance-change memory 10. In this embodiment, since the four memory units MU are aligned in one row of the memory cell array MCA, the IO number is four. When the IO number of the resistance-change memory 10 is four, the four memory units MU aligned in a row direction are simultaneously activated at the time of reading or writing data.

FIG. 2 is a block diagram showing a configuration of one memory unit MU. The memory cell array MCA is constituted of (m×n) memory cells MC arranged in a matrix. Each of "m" and "n" is a natural number which is equal to or above 1. In the memory cell array MCA, m word lines WL1 to WLm are arranged in such a manner that these lines are extended in the row direction. Further, in the memory cell array MCA, n bit lines BL1 to BLn are arranged in such a manner that they are extended in a column direction. A memory cell MC is arranged in each of intersection regions of the bit lines BL and the word lines WL, and each memory cell MC is connected to the bit line BL and the word line WL associated therewith.

The row decoder RD is connected to the word lines WL1 to WLm. The row decoder RD selects any one of the word lines WL1 to WLm based on an address supplied from the peripheral circuit 12.

The column decoder CD is connected to the bit lines BL1 to BLn. The column decoder CD selects any one of the bit lines BL1 to BLn based on an address supplied from the peripheral circuit 12.

A voltage clamp circuit 14 clamps (sets) the bit line BL selected by the column decoder CD to a predetermined read voltage. The sense amplifier SA uses a current in the bit line BL (i.e., a bit line connected to the accessed memory cell MC) selected by the column decoder CD and a reference current to detect and amplify data in the accessed memory cell MC.

The write driver WD as a write circuit writes data to the accessed memory cell MC. For example, the write driver WD supplies a write current to the bit line BL selected by the column decoder CD to write data to the accessed memory cell MC.

As the resistance-change memory, various kinds of memories such as a magnetic random access memory (MRAM), resistive random access memory (ReRAM), or phase-change random access memory (PCRAM) can be utilized. In this embodiment, the MRAM will be taken as an example and described. The MRAM includes a magnetic tunnel junction (MTJ) element which utilizes the tunneling magnetoresistive (TMR) effect as a memory element, and stores information based on a magnetization state of this MTJ element.

Figure 3:
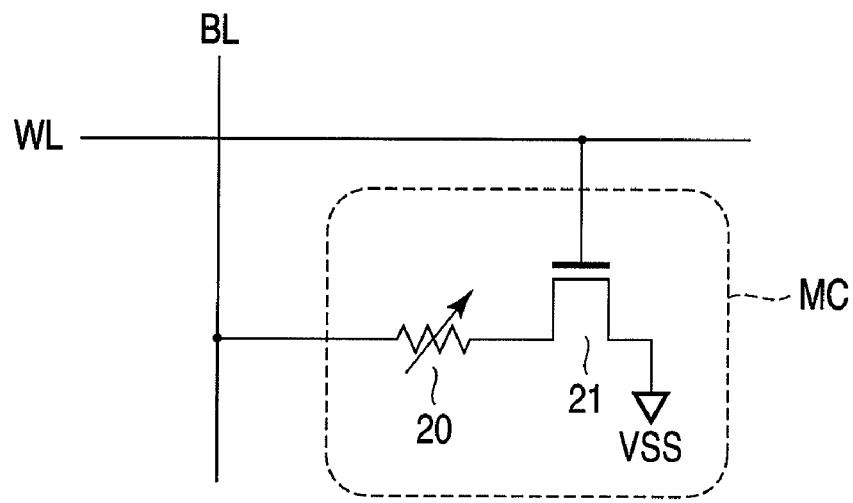
FIG. 3 is a circuit diagram showing a configuration of a memory cell MC.

FIG. 3 is a circuit diagram showing a configuration of the memory cell MC. The memory cell MC includes an MTJ element (magnetoresistive element) 20 as a variable-resistance element and a select transistor 21. The select transistor 21 is, e.g., an N-channel metal oxide semiconductor field-effect transistor (MOSFET). One end of the MTJ element 20 is connected to the bit line BL, and the other end of the same is connected to a drain of the select transistor 21. A gate of the select transistor 21 is connected to the word line WL. A source of the select transistor 21 is grounded through, e.g., a source line (to which ground voltage VSS is applied).

Figure 4:
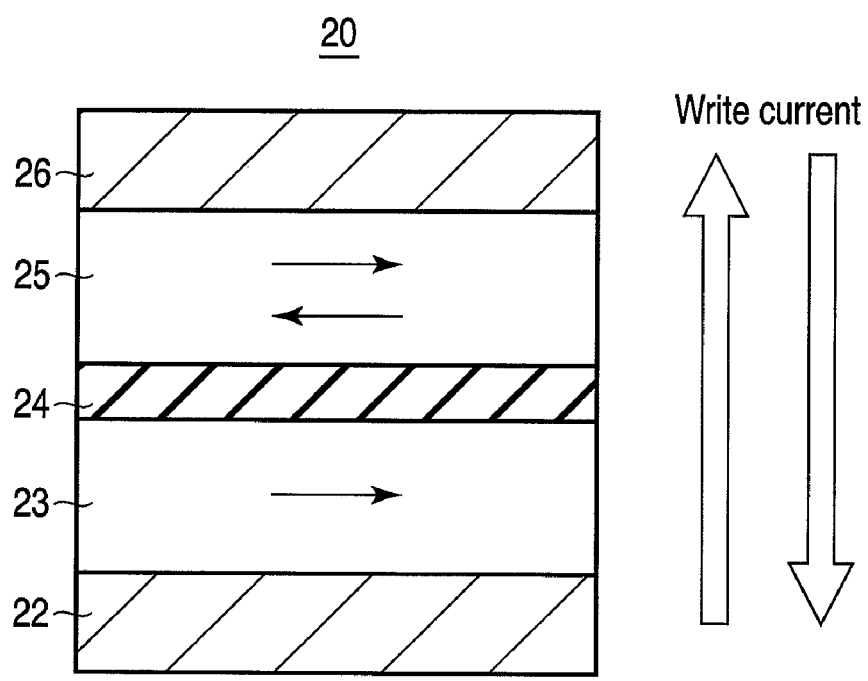
FIG. 4 is a schematic view showing a configuration of a variable-resistance element (MTJ element) 20.

FIG. 4 is a schematic view showing a configuration of the MTJ element 20. The MTJ element 20 is configured by sequentially laminating a lower electrode 22, a fixed layer (pinned layer) 23, an intermediate layer 24, a recording layer (free layer) 25, and an upper electrode 26. It is to be noted that a lamination order of the layers forming the MTJ element 20 may be reversed.

The fixed layer 23 consists of a ferromagnetic material and has a fixed direction of magnetization. For example, providing an antiferromagnetic layer (not shown) in adjacent to the fixed layer 23 enables fixing the direction of magnetization of the fixed layer 23. The free layer 25 consists of a ferromagnetic material and has a variable direction of magnetization. The intermediate layer 24 consists of a non-magnetic material, and a non-magnetic metal, a non-magnetic semiconductor, or an insulator can be specifically utilized.

A direction of magnetization of each of the fixed layer 23 and the free layer 25 may be vertical to a film surface (perpendicular magnetization), or may be parallel to the film surface (in-plane magnetization). The perpendicular magnetization has an advantage that an element shape does not have to be controlled to determine the direction of magnetization as different from the in-plane magnetization and this magnetization is suitable for miniaturization.

It is to be noted that each of the fixed layer 23 and the free layer 25 does not have to be restricted to such a single layer as depicted in the drawing and it may have a laminated structure consisting of a plurality of ferromagnetic layers. Further, each of the fixed layer 23 and the free layer 25 consists of three layers, i.e., a first ferromagnetic layer, a non-magnetic layer, and a second ferromagnetic layer, and may have an antiferromagnetic coupled structure subjected to magnetic coupling (interlayer exchange coupling) in such a manner that the directions of magnetization of the first and second ferromagnetic layers become anti-parallel or may have a ferromagnetic coupled structure subjected to magnetic coupling (interlayer exchange coupling) in such a manner that the directions of magnetization of the first and second ferromagnetic layers become parallel.

Moreover, the MTJ element 20 may have a double junction structure. The MTJ element 20 having the double junction structure has a laminated structure where a first fixed layer, a first intermediate layer, a free layer, a second intermediate layer, and a second fixed layer are sequentially laminated. Such a double junction structure has an advantage that the magnetization reversal of the free layer 25 based on spin injection can be readily controlled.

FIGS. 5A and 5B are views showing a low-resistance state and a high-resistance state of the MTJ element 20. The low-resistance state and the high-resistance state of the MTJ element 20 based on a spin injection write scheme will now be described. It is to be noted that a current means a flow of electrons in this description.

A description will be first given as to a parallel state (low-resistance state) where the directions of magnetization of the fixed layer 23 and the free layer 25 become parallel. In this case, a current flowing from the fixed layer 23 toward the free layer 25 is supplied. Majority electrons in electrons having passed through the fixed layer 23 have spin parallel to the direction of magnetization of the fixed layer 23. When a spin angular momentum of the majority electrons transfers to the free layer 25, a spin torque is applied to the free layer 25, and the direction of magnetization of the free layer 25 is set to be parallel to the direction of magnetization of the fixed layer 23.

In this parallel arrangement, the resistance of the MTJ element 20 becomes minimum, and this situation is defined as data "0".

A description will now be given as to an anti-parallel state (high-resistance state) where the directions of magnetization of the fixed layer 23 and the free layer 25 become anti-parallel. In this case, a current flowing from the free layer 25 toward the fixed layer 23 is supplied. Majority electrons in electrons reflected by the fixed layer 23 have spin which is anti-parallel to the direction of magnetization of the fixed layer 23. When a spin angular momentum of the majority electrons transfers to the free layer 25, a spin torque is applied to the free layer 25, and the direction of magnetization of the free layer 25 is set to be anti-parallel to the direction of magnetization of the fixed layer 23. In this anti-parallel arrangement, the resistance of the MTJ element 20 becomes maximum, and this situation is defined as data "1".

A specific structure of the voltage clamp circuit 14 will now be described. FIG. 6 is a circuit diagram showing a configuration of the voltage clamp circuit 14. FIG. 6 shows a state where one bit line BL selected by the column decoder CD is connected to the voltage clamp circuit 14 and the sense amplifier SA. The voltage clamp circuit 14 and the sense amplifier SA are shared by the bit lines BL1 to BLn in one memory unit MU.

The voltage clamp circuit 14 includes N-channel MOSFET 14-1 which clamps the bit line BL to a predetermined read voltage. A read control voltage VCLMP is applied to a gate of MOSFET 14-1. This read control voltage VCLMP is supplied from the controller 13. MOSFET 14-1 can arbitrarily set the read voltage for the bit line BL in accordance with the magnitude of the read control voltage VCLMP.

A source of N-channel MOSFET 14-2 as a switch element is connected to a drain of MOSFET 14-1. A drain of MOSFET 14-2 is connected to a first input terminal of the sense amplifier SA. A control signal (read enable signal) REN from the controller 13 is supplied to a gate of MOSFET 14-2. A constant-current source 15 which generates a reference current Iref is connected to a second input terminal of the sense amplifier SA.

A drain of N-channel MOSFET 14-3 as a switch element is connected to a source of MOSFET 14-1. A source of MOSFET 14-3 is connected to the bit line BL connected to an accessed memory cell MC through the column decoder CD (not shown). Control signal REN is supplied to a gate of MOSFET 14-3 from the controller 13.

A drain of N-channel MOSFET 14-4 as a switch element is connected to a drain of MOSFET 14-1. A source of MOSFET 14-4 is grounded (ground voltage VSS is applied). A control signal bREN from the controller 13 is supplied to a gate of MOSFET 14-2. Control signal bREN is an inversion signal of control signal REN.

A drain of N-channel MOSFET 14-5 as a switch element is connected to a source of MOSFET 14-1. A source of MOSFET 14-5 is grounded. Control signal bREN from the controller 13 is supplied to a gate of MOSFET 14-5.

(Operation of Voltage Clamp Circuit 14)

Figures 7, 8:
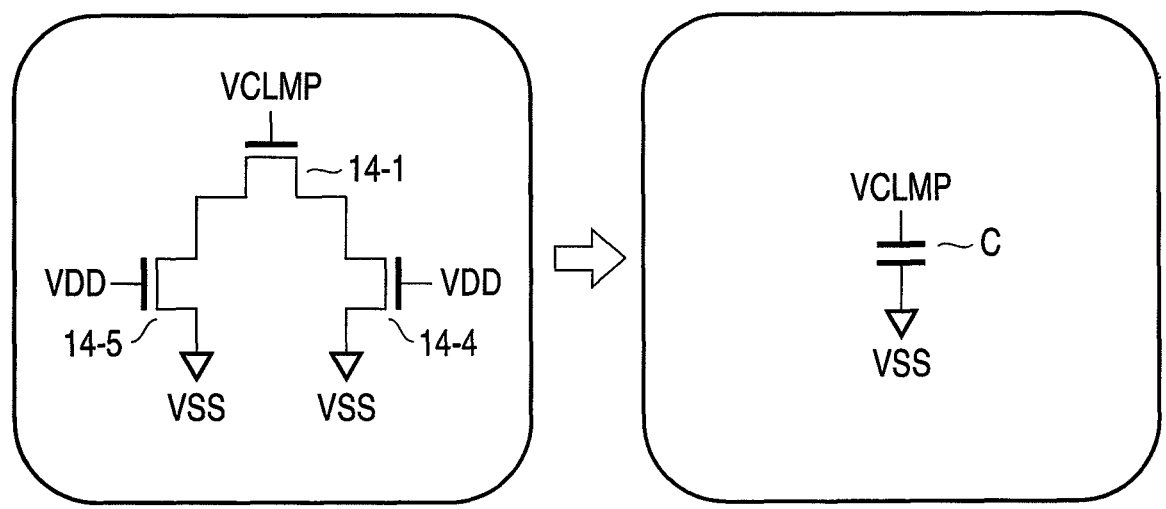
FIG. 7 is a view for explaining levels of control signals REN and bREN when the memory unit MU is active and inactive.
FIG. 8 is a view for explaining a state of an MOSFET 14-1 when a sense amplifier SA is inactive.

An operation of the voltage clamp circuit 14 will now be described. FIG. 7 is a view explaining levels of control signals REN and bREN when the memory unit MU is active and inactive.

An operation of the voltage clamp circuit 14 when the memory unit MU is active will be first explained. When a data read operation starts, the controller 13 activates the memory unit MU including the memory cell MC to be accessed, and the sense amplifier SA included in this memory unit MU is thereby activated.

Subsequently, a predetermined read control voltage VCLMP is applied to the gate of voltage clamp MOSFET 14-1 from the controller 13. Then, the controller 13 makes control signal REN high, and MOSFETs 14-2 and 14-3 are turned on. It is to be noted that control signal REN is supplied to the gates of both MOSFET 14-2 and MOSFET 14-3. Therefore, MOSFETs 14-2 and 14-3 are simultaneously activated.

On the other hand, when the sense amplifier SA is active, the controller 13 makes control signal bREN low, and MOSFETs 14-4 and 14-5 are turned off. It is to be noted that control signal bREN is supplied to the gates of both MOSFET 14-4 and MOSFET 14-5. Therefore, MOSFETs 14-4 and 14-5 are simultaneously deactivated.

As a result, a read current (cell current Icell) flows through the accessed memory cell MC via the bit line BL. At this time, a read voltage which is approximately "VCLMP-Vth" is applied to the memory cell MC. "Vth" is a threshold voltage of MOSFET 14-1. Furthermore, the sense amplifier SA can read data stored in the memory cell MC by comparing the cell current Icell flowing through the memory cell MC with a reference current Iref.

An operation of the voltage clamp circuit 14 when the memory unit MU is inactive will now be described. The controller 13 inactivates each memory unit MC which does not include the memory cell MC to be accessed when reading data, and the sense amplifier SA included in the memory unit MU is also deactivated. Additionally, all the sense amplifiers SA are deactivated at the time of operations other than the read operation.

When the sense amplifier SA is inactive, the controller 13 makes control signal (read enable signal) REN low, and MOSFETs 14-2 and 14-3 are turned off. That is, voltage clamp MOSFET 14-1 is electrically divided into the bit line BL and the sense amplifier SA. It is to be noted that control signal REN is supplied to the gates of both MOSFET 14-2 and MOSFET 14-3. Therefore, MOSFETs 14-2 and 14-3 are simultaneously deactivated.

On the other hand, when the sense amplifier SA is inactive, the controller 13 makes control signal bREN high, and MOSFETs 14-4 and 14-5 are turned on. It is to be noted that control signal bREN is supplied to the gates of MOSFETs 14-4 and 14-5. Therefore, MOSFETs 14-4 and 14-5 are simultaneously activated.

FIG. 8 is a view for explaining a state of MOSFET 14-1 when the sense amplifier SA is inactive. Since the gates of MOSFETs 14-4 and 14-5 have been made high (power supply voltage VDD), and the source and the drain of voltage clamp MOSFET 14-1 are grounded. At this time, as shown in FIG. 8, MOSFET 14-1 functions as a stabilizing capacitance C connected to a part between the read control voltage VCLMP and the ground voltage VSS. This stabilizing capacitance C is mainly obtained by a gate capacitance of MOSFET 14-1.

The stabilizing capacitance of the entire chip corresponds to a sum total of capacitances of MOSFETs 14-1 included in all the inactive memory units MU, and it is sufficiently large as the stabilizing capacitance. Further, even though the ground voltage VSS fluctuates due to, e.g., power supply noise, since the read control voltage VCLMP likewise fluctuates due to capacitance coupling, a read voltage "VCLMP-Vth-VSS" applied to the memory cell is compensated to be kept constant. Therefore, the highly accurate read operation can be realized.

The stabilizing capacitance of MOSFET 14-1 varies depending on channel area. When the stabilizing capacitance is large, an effect of reducing the power supply noise is enhanced. Therefore, a channel area of MOSFET 14-1 is set to be relatively large, and it is set to be larger than at least channel areas of MOSFETs 14-2 to 14-5 as the switch elements. Specifically, the channel area of MOSFET 14-1 is ten times or more as large as the channel area of each of MOSFETs 14-2 to 14-5, and it is set to 1 square micrometer (1 μm$^2$) or above. Further, increasing the channel area of MOSFET 14-1 enables reducing a fluctuation in threshold voltage thereof.

Figure 9:
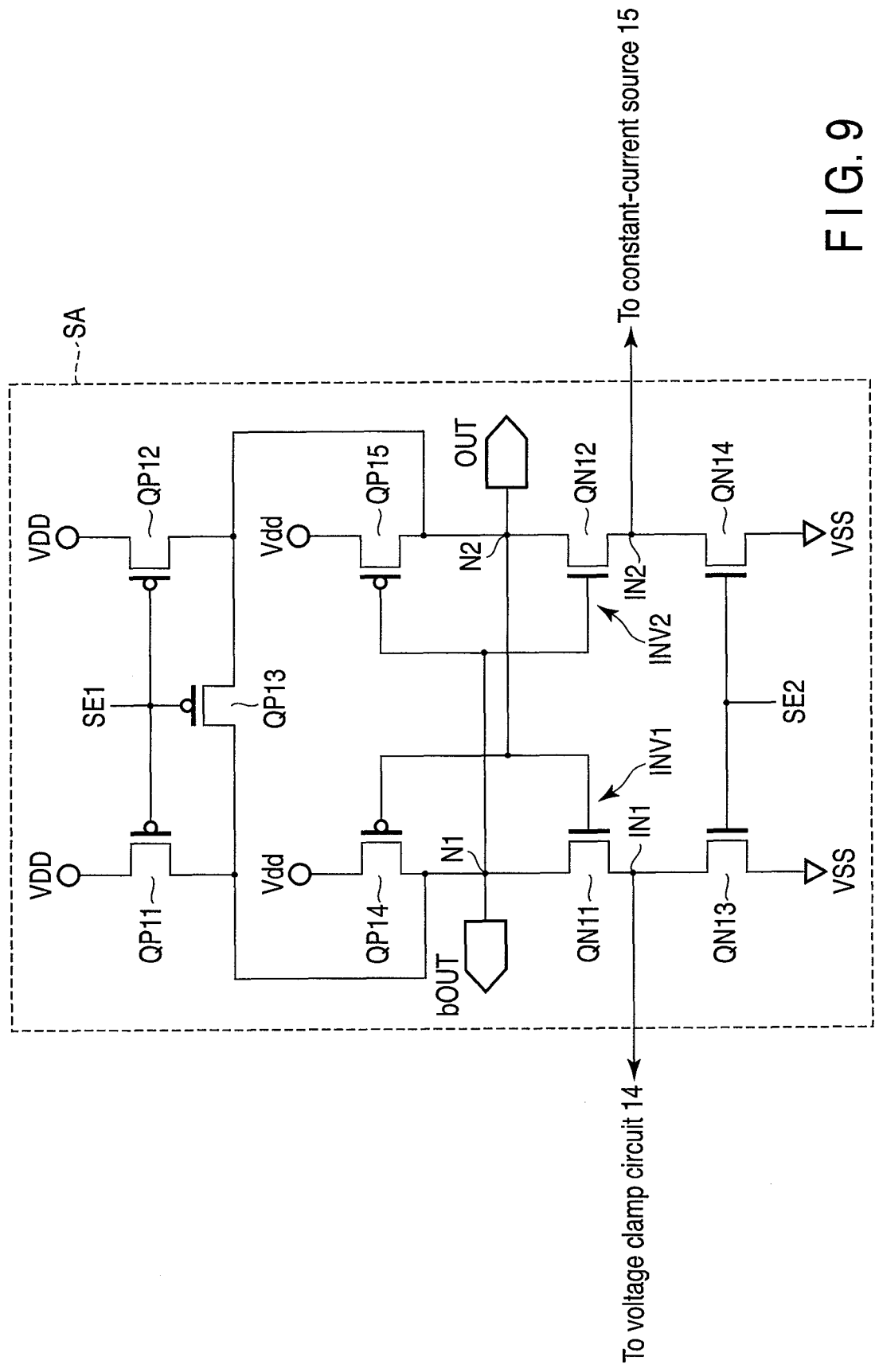
FIG. 9 is a circuit diagram showing an example of the sense amplifier SA.

A configuration of the sense amplifier SA will now be described. FIG. 9 is a circuit diagram showing an example of the sense amplifier SA.

The sense amplifier SA includes two inverters INV1 and INV2, and these inverters INV1 and INV2 constitute a latch circuit. An output of inverter INV1 is connected to an input of inverter INV2 through a memory node N1. An output of inverter INV2 is connected to an input of inverter INV1 through a memory node N2. The memory node N1 is connected to a second output terminal bOUT. The memory node N2 is connected to a first output terminal OUT. A voltage at the first output terminal OUT and a potential at the second output terminal bOUT have a complementary relationship.

Specifically, inverter INV1 is constituted of a P-channel MOSFET QP14 and N-channel MOSFET QN11 connected to a part between a power supply potential (VDD) terminal and a first input terminal IN1 in series. A connection node between MOSFETs QP14 and QN11 is associated with the memory node N1. A gate of MOSFET QP14 is connected to a gate of MOSFET QN11.

Inverter INV12 is constituted of a P-channel MOSFET QP15 and N-channel MOSFET QN12 connected to a part between a power supply potential (VDD) terminal and a second input terminal IN2 in series. A connection node of s MOSFETs QP15 and QN12 is associated with the memory node N2. A gate of MOSFET QP15 is connected to a gate of MOSFET QN12. The memory node N1 is connected to the gate of MOSFET QP15. The memory node N2 is connected to the gate of MOSFET QP14.

The first input terminal IN1 is connected to the voltage clamp circuit 14. Further, the first input terminal IN1 is grounded through N-channel MOSFET QN13. The second input terminal IN2 is connected to the constant-current source 15 which generates the reference current Iref. Furthermore, the second input terminal IN2 is grounded through the N-channel MOSFET QN14. A control signal SE2 is supplied to gates of MOSFETs QN13 and QN14.

P-channel MOSFETs QP11 to QP13 which precharge the memory nodes N1 and N2 to the power supply voltage VDD are connected to the memory nodes N1 and N2. That is, sources of MOSFETs QP11 and QP12 are connected to power supply potential (VDD) terminals, respectively. A drain of MOSFET QP11 is connected to the memory node N1. A drain of MOSFET QP12 is connected to the memory node N2.

MOSFET QP13 is connected to a part between the drains of MOSFETs QP11 and QP12. A control signal SE1 is supplied to gates of MOSFETs QP11 to QP13, respectively.

The sense amplifier SA depicted in FIG. 9 is a current differential type and operates as follows. First, prior to a sensing operation, control signal SE1 is made low. As a result, MOSFETs QP11 to QP13 are turned on, and the memory nodes N1 and N2 are precharged to the power supply voltage VDD. It is to be noted that control signal SE2 has been made low, and MOSFETs QN13 and QN14 are off.

Subsequently, the cell current Icell is supplied to the first input terminal IN1, and the reference current Iref is supplied to the second input terminal IN2. Then, control signal SE1 is made high, and MOSFETs QP11 to QP13 are turned off. As a result, the sensing operation of the sense amplifier SA starts.

The sense amplifier SA compares the cell current Icell in the first input terminal IN1 with the reference current Iref in the second input terminal IN2. Further, a voltage associated with stored data in the memory cell MC is set to the memory nodes N1 and N2. After elapse of an appropriate time, control signal SE2 is made high, and voltages at the memory nodes N1 and N2 are determined. The voltage of the memory node N1 is output from the second output terminal bOUT. The voltage of the memory node N2 is output from the first output terminal OUT.

As explained above, this embodiment includes MOSFET 14-1 which clamps the bit line BL to a predetermined read voltage when reading data, and also includes MOSFET 14-2 which disconnects one end of the current path of MOSFET 14-1 from the sense amplifier SA and MOSFET 14-3 which disconnects the other end of the current path of MOSFET 14-1 from the bit line BL when the sense amplifier SA is inactive. Furthermore, this embodiment includes MOSFET 14-4 which grounds the one end of the current path of MOSFET 14-1 and MOSFET 14-5 which grounds the other end of the current path of MOSFET 14-1 when the sense amplifier SA is inactive.

Therefore, according to this embodiment, a gate capacitance of voltage clamp MOSFET 14-1 can be utilized as the stabilizing capacitance when the sense amplifier SA is inactive. That is, even if the ground voltage VSS fluctuates due to, e.g., power supply noise, the read control voltage VCLMP applied to the gate of MOSFET 14-1 likewise fluctuates due to capacitance coupling. Therefore, the read voltage applied to the memory cell is compensated to be kept constant. As a result, the highly accurate read operation can be realized, thereby improving reliability of data.

Moreover, in the resistance-change memory having the plurality of memory units MU, the many memory units MU which do not include the memory cell MC to be accessed, i.e., which are inactive at the time of reading are present. Therefore, the number of MOSFETs 14-1 which are utilized as the stabilizing capacitances increases, and hence the stabilizing capacitance of the entire chip can be enlarged. Moreover, since the large stabilizing capacitance can be obtained, the power supply noise can be reduced, and a fluctuation in the read control voltage VCLMP can be suppressed.

Additionally, a channel area of each MOSFET 14-1 is set to be large, e.g., 1 square micrometer (1 μm$^2$) or above. As a result, a fluctuation in threshold value of MOSFET 14-1 can be suppressed, and the stabilizing capacitance of the entire chip can be increased.

Second Embodiment

A second embodiment includes a reference cell which generates a reference current Iref as means for supplying the reference current Iref to a second input terminal of a sense amplifier SA and a reference voltage clamp MOSFET which applies a reference voltage to this reference cell. Further, this reference voltage clamp MOSFET is used as a stabilizing capacitance.

Figure 10:
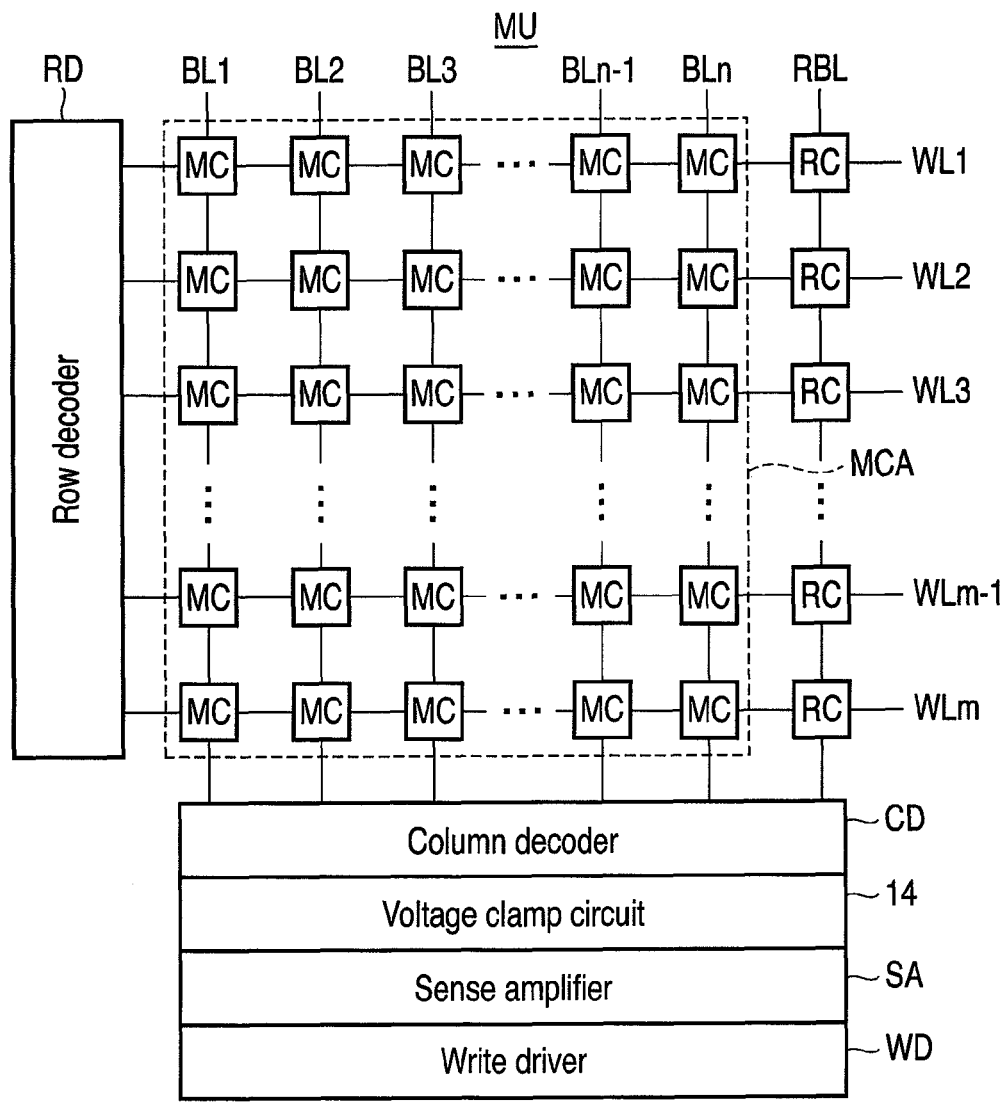
FIG. 10 is a block diagram showing a configuration of one memory unit MU according to a second embodiment.

An entire configuration of a resistance-change memory 10 according to the second embodiment is the same as that depicted in FIG. 1. FIG. 10 is a block diagram showing a configuration of one memory unit MU according to the second embodiment.

The memory unit MU includes m reference cells RC. The m reference cells RC are connected to m word lines WL1 to WLm, respectively. Furthermore, the m reference cells RC are connected to one reference bit line RBL extended in a column direction. The reference bit line RBL is selected by a column decoder CD. Moreover, the reference bit line RBL is connected to a voltage clamp circuit 14 and a sense amplifier SA through the column decoder CD.

Figure 11:
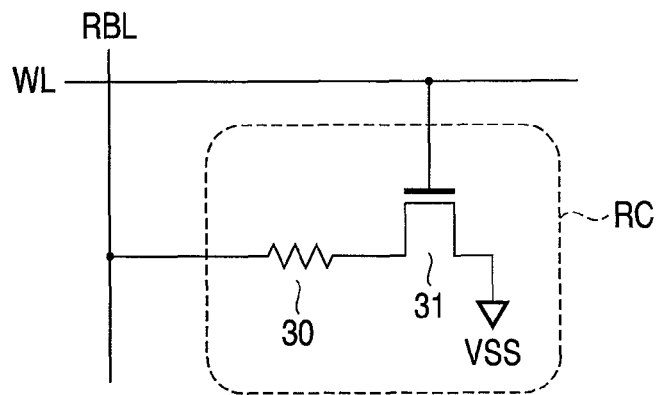
FIG. 11 is a circuit diagram showing a configuration of a reference cell RC.

FIG. 11 is a circuit diagram showing a configuration of the reference cell RC. The reference cell RC includes a fixed-resistance element 30 and a select transistor 31. The select transistor 31 is, e.g., an N-channel MOS transistor. One end of the fixed-resistance element 30 is connected to the reference bit line RBL, and the other end of the same is connected to a drain of the select transistor 31. A gate of the select transistor 31 is connected to the word line WL. A source of the select transistor 31 is grounded through, e.g., a source line.

The fixed-resistance element 30 is fixed to either a low- or high-resistance state of the memory cell MC or fixed to an intermediate resistance (reference value) between the low- and high-resistance states of the memory cell MC. The fixed-resistance element 30 is formed by the same process as that for the MTJ element 20 and basically has the same lamination structure as that of the MTJ element 20. Furthermore, a method of fixing the resistance of the fixed-resistance element 30 to a predetermined reference value can be realized by changing areas of two ferromagnetic layers in a state where the directions of magnetization of these ferromagnetic layers are fixed.

Figure 12:
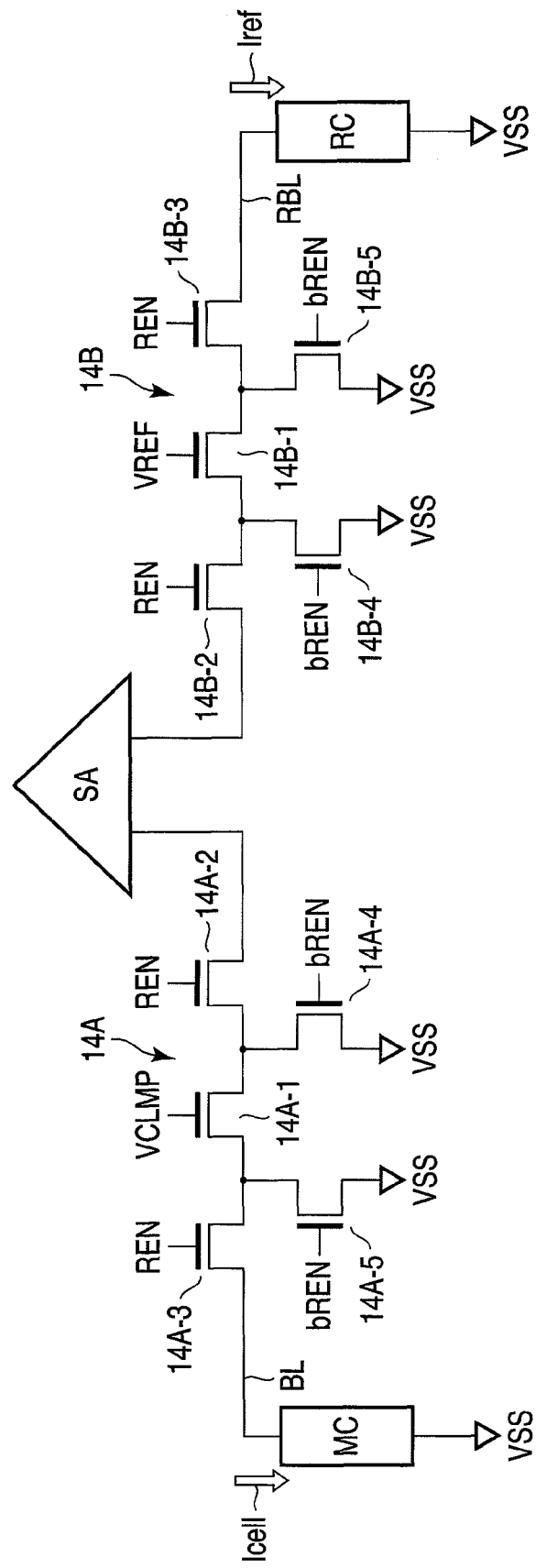
FIG. 12 is a circuit diagram showing configurations of voltage clamp circuits 14A and 14B.

A specific configuration of the voltage clamp circuit 14 will now be described. In this embodiment, the voltage clamp circuit 14 depicted in FIG. 10 includes voltage clamp circuit 14A for the memory cells MC and voltage clamp circuit 14B for the reference cells RC. FIG. 12 is a circuit diagram showing configurations of voltage clamp circuits 14A and 14B. It is to be noted that FIG. 12 shows a state where one bit line BL selected by the column decoder CD is connected to the voltage clamp circuit 14 and the sense amplifier SA and a reference bit line RBL selected by the column decoder CD is connected to voltage clamp circuit 14B and the sense amplifier SA. As a reference cell selecting method, for example, when reading data from a memory cell in an arbitrary first memory unit, the utilized are reference cells included in the memory units from which data is not read except the first memory unit.

In FIG. 12, the voltage clamp circuit 14 for the memory cells MC includes voltage clamp N-channel MOSFET 14A-1 and N-channel MOSFETs 14A-2 to 14A-5 as switch elements. Configurations and a connection relationship of MOSFETs 14A-1 to 14A-5 are the same as those of the voltage clamp circuit 14 depicted in FIG. 6.

Voltage clamp circuit 14B for the reference cells RC includes N-channel MOSFET 14B-1 that clamps the reference bit line RBL to a predetermined reference voltage. A control voltage VREF is supplied to a gate of MOSFET 14B-1. This control voltage VREF is supplied from a controller 13. MOSFET 14B-1 can arbitrarily set a reference voltage of the reference bit line RBL in accordance with the magnitude of the control voltage VREF. A reference current Iref flows through the reference cell RC via the reference bit line RBL. At this time, a reference voltage which is approximately "VREF-Vth" is applied to the reference cell RC.

A source of N-channel MOSFET 14B-2 as a switch element is connected to a drain of MOSFET 14B-1. A drain of MOSFET 14B-2 is connected to a second input terminal of the sense amplifier SA. A control signal REN from the controller 13 is supplied to a gate of MOSFET 14B-2.

A drain of N-channel MOSFET 14B-3 as a switch element is connected to a source of MOSFET 14B-1. A source of MOSFET 14B-3 is connected to the reference bit line RBL through the column decoder CD (not shown). Control signal REN from the controller 13 is supplied to a gate of MOSFET 14B-3.

A drain of N-channel MOSFET 14B-4 as a switch element is connected to a drain of MOSFET 14B-1. A source of MOSFET 14B-4 is grounded. A control signal bREN from the controller 13 is supplied to the gate of MOSFET 14B-2.

A drain of N-channel MOSFET 14B-5 as a switch element is connected to the source of MOSFET 14B-1. A source of MOSFET 14B-5 is grounded. Control signal bREN from the controller 13 is supplied to a gate of MOSFET 14B-5.

A channel area of MOSFET 14B-1 is set to be relatively large, and it is set to be larger than at least channel areas of MOSFETs 14B-2 to 14B-5 as the switch elements. Specifically, the channel area of MOSFET 14B-1 is ten times or more as large as the channel area of each of MOSFETs 14B-2 to 14B-5, and it is set to 1 square micrometer (1 µm$^2$) or above. Increasing the channel area of MOSFET 14B-1 enables reducing a fluctuation in threshold voltage.

Operations of voltage clamp circuits 14A and 14B are the same as that of the voltage clamp circuit 14 described in the first embodiment. Therefore, according to this embodiment, gate capacitances of voltage clamp MOSFETs 14A-1 and 14B-1 can be used as a stabilizing capacitance when the sense amplifier SA is inactive. That is, according to this embodiment, the stabilizing capacitance which is approximately double that in the first embodiment can be obtained.

Furthermore, even when the ground voltage VSS fluctuates due to, e.g., power supply noise, a control voltage VREF which is applied to the gate of MOSFET 14B-1 likewise fluctuates due to capacitance coupling. Therefore, the reference voltage applied to the reference cell is compensated to be kept constant. As a result, a highly accurate read operation can be realized, thereby improving reliability of data.

Example

As explained above, as the resistance-change memory according to this embodiment, various memories other than the MRAM can be used. As other examples of the resistance-change memory, the ReRAM and PCRAM will be described below.

(ReRAM)

FIG. 13 is a schematic view showing a configuration of a variable-resistance element 20 used in the ReRAM. The variable-resistance element 20 includes a lower electrode 22, an upper electrode 26, and a recording layer 40 sandwiched between these electrodes.

The recording layer 40 consists of a perovskite metal oxide or a transition metal oxide such as bimetal oxide. As the perovskite metal oxide, there is, e.g., PCMO ($Pr_{0.7}Ca_{0.3}MnO_3$), Nb added $SrTi(Zr)O_3$, or Cr added $SrTi(Zr)O_3$. As the bimetal oxide, there is, e.g., NiO, $TiO_2$, or $Cu_2O$.

The resistance of the variable-resistance element 20 is varied by changing the polarity of a voltage applied thereto (bipolar type) or by changing the absolute voltage applied thereto (unipolar type). Therefore, the variable-resistance element 20 is set to a low-resistance state and a high-resistance state by controlling an application voltage. It is to be noted that the type to be adopted, i.e., bipolar or unipolar, differs depending on a material of the recording layer to be selected.

For example, in case of the bipolar variable-resistance element 20, assuming that a voltage required to change the variable-resistance element 20 to the low-resistance state (set state) from the high-resistance state (reset state) is a reset voltage Vset and a voltage required to change the same to the high-resistance state (reset state) from the low-resistance state (set state) is a reset voltage Vreset, the set voltage Vset is set to a positive bias which is used to apply a positive voltage to the upper electrode 26 with respect to the lower electrode 22, and the reset voltage Vreset is set to a negative bias which is used to apply a negative voltage to the upper electrode 26 with respect to the lower electrode 22. Furthermore, associating the low-resistance state and the high-resistance state with data "0" and data "1" enables the variable-resistance element 20 to store 1-bit data.

When reading data, a sufficiently small read voltage which is approximately 1/1000 to 1/4 of the reset voltage Vreset is applied to the variable-resistance element 20. Moreover, detecting a current flowing through the variable-resistance element 20 at this moment enables reading data.

(PCRAM)

FIG. 14 is a schematic view showing a configuration of a variable-resistance element 20 utilized in the PCRAM. The variable-resistance element 20 is configured by sequentially laminating a lower electrode 22, a heater layer 41, a recording layer 42, and an upper electrode 26.

The recording layer 42 consists of a phase-change material, and it is set to a crystalline or an amorphous state depending on heat generated at the time of writing. As the material of the recording layer 42, there is a chalcogen compound such as Ge—Sb—Te, In—Sb—Te, Ag—In—Sb—Te, or Ge—Sn—Te. These materials are desirable for assuring high-speed switching properties, repetitive recording stability, and high reliability.

The heater layer 41 is in contact with a bottom surface of the recording layer 42. It is desirable for the area of the heater layer 41 which is in contact with the recording layer 42 to be smaller than the area of the bottom surface of the recording layer 42. That is because a heating portion is reduced and a write current or voltage is decreased by diminishing the contact portion of the heater layer 41 and the recording layer 42. It is desirable for the heater layer 41 to consist of a conductive material, for example, one selected from TiN, TiAlN, TiBN, TiSiN, TaN, TaAlN, TaBN, TaSiN, WN, WAlN, WBN, WSiN, ZrN, ZrAlN, ZrBN, ZrSiN, MoN, Al, Al—Cu, Al—Cu—Si, WSi, Ti, Ti—W, and Cu. Furthermore, the heater layer 41 may consist of the same material as that of the later-explained lower electrode.

The area of the lower electrode 22 is larger than the area of the heater layer 41. The upper electrode 26 has the same planar shape as that of the recording layer 42. As a material of each of the lower electrode 22 and the upper electrode 26, there is a refractory metal such as Ta, Mo, or W.

A heating temperature of the recording layer 42 varies by controlling the magnitude of a current pulse and a width of the same applied thereto, and the recording layer 42 fluctuates between the crystalline and amorphous states. Specifically, at the time of writing, a voltage or current is applied to a part between the lower electrode 22 and the upper electrode 26, and the current flows through the lower electrode 22 from the upper electrode 26 via the recording layer 42 and the heater layer 41. When the recording layer 42 is heated to a temperature close to melting point, the recording layer 42 varies to an amorphous phase (high-resistance phase), and the amorphous state is maintained even though application of the voltage or current is stopped.

On the other hand, when the voltage or current is applied to a part between the lower electrode 22 and the upper electrode 26 and the recording layer 42 is heated to a temperature close to that suitable for crystallization of the recording layer 42, the recording layer 42 varies to a crystalline phase (low-resistance phase), and the crystalline state is kept even though the application of the voltage or current is stopped. When the recording layer 42 is changed to the crystalline state, it is sufficient to reduce the magnitude of a current pulse which is applied to the recording layer 42 and increase a width of the current pulse as compared with the case where the recording layer 42 is changed to the amorphous state. The resistance of the recording layer 42 can be changed by applying the voltage or current to the part between the lower electrode 22 and the upper electrode 26 to heat the recording layer 42 in this manner.

Whether the recording layer 42 has the crystalline or amorphous phase can be determined by applying a low voltage or low current which does not lead to crystallization or amorphization of the recording layer 42 to the part between the lower electrode 22 and the upper electrode 26 and reading the voltage or current between the lower electrode 22 and the upper electrode 26. Therefore, associating the low-resistance state and the high-resistance state with data "0" and data "1" enables reading 1-bit data from the variable-resistance element 20.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell configured to store data, comprising a resistance configured to vary based on the stored data;
   a bit line connected to the memory cell;
   a first Metal-Oxide-Semiconductor Field-Effect Transistor (MOSFET) configured to hold the bit line to a read voltage while reading data;
   a sense amplifier configured to detect the stored data in the memory cell based on a current flowing through the bit line;
   a first switch configured to connect the sense amplifier to a drain of the first MOSFET;
   a second switch configured to connect a source of the first MOSFET to the bit line;
   a third switch configured to connect the drain of the first MOSFET to a ground terminal; and
   a fourth switch configured to connect the source of the first MOSFET to a ground terminal,
   wherein the first and second switches are on and the third and fourth switches are off when the sense amplifier is active, and
   the first and second switches are off and the third and fourth switches are on when the sense amplifier is inactive.

2. The device of claim 1, wherein
   the first and second switches are simultaneously turned either on or off, and
   the third and fourth switches are simultaneously turned either on or off.

3. The device of claim 1, wherein the read voltage is set based on a control voltage applied to a gate of the first MOSFET.

4. The device of claim 1, wherein the first MOSFET is configured to function as a stabilizing capacitance when the sense amplifier is inactive.

5. The device of claim 1, further comprising:
   a reference cell comprising a reference value used in determining a resistance of the memory cell;

a reference bit line connected to the reference cell;
a second MOSFET configured to hold the reference bit line to a reference voltage while reading data;
a fifth switch configured to connect the sense amplifier to a drain of the second MOSFET;
a sixth switch configured to connect a source of the second MOSFET to the reference bit line;
a seventh switch configured to connect the drain of the second MOSFET to a ground terminal; and
an eighth switch configured to connect the source of the second MOSFET to a ground terminal,
wherein the fifth and sixth switches are on and the seventh and eighth switches are off when the sense amplifier is active, and
the fifth and sixth switches are off and the seventh and eighth switches are on when the sense amplifier is inactive.

6. The device of claim 5, wherein the fifth and sixth switches are simultaneously turned either on or off, and
the seventh and eighth switches are simultaneously turned either on or off.

7. The device of claim 5, wherein the reference voltage is set based on a control voltage applied to a gate of the second MOSFET.

8. The device of claim 5, wherein the second MOSFET is configured to function as a stabilizing capacitance when the sense amplifier is inactive.

9. The device of claim 1, wherein the memory cell comprises a fixed layer comprising a fixed direction of magnetization, a recording layer comprising a variable direction of magnetization, and a non-magnetic layer between the fixed layer and the recording layer.

10. A semiconductor memory device comprising:
a memory cell configured to store data, comprising a resistance configured to vary based on the stored data;
a bit line connected to the memory cell;
a first MOSFET configured to hold the bit line to a read voltage while reading data;
a sense amplifier configured to detect the stored data in the memory cell based on a current flowing through the bit line;
a second MOSFET configured to connect the sense amplifier to a drain of the first MOSFET;
a third MOSFET configured to connect a source of the first MOSFET to the bit line;
a fourth MOSFET configured to connect the drain of the first MOSFET to a ground terminal; and
a fifth MOSFET configured to connect the source of the first MOSFET to a ground terminal,
wherein the second and third MOSFETs are on and the fourth and fifth MOSFETs are off when the sense amplifier is active, and
the second and third MOSFETs are off and the fourth and fifth MOSFETs are on when the sense amplifier is inactive.

11. The device of claim 10, wherein a channel area of the first MOSFET is larger than a channel area of the second MOSFET.

12. The device of claim 10, wherein
the second and third MOSFETs are simultaneously turned either on or off, and
the fourth and fifth MOSFETs are simultaneously turned either on or off.

13. The device of claim 10, wherein the read voltage is set based on a control voltage applied to a gate of the first MOSFET.

14. The device of claim 10, wherein the first MOSFET is configured to function as a stabilizing capacitance when the sense amplifier is inactive.

15. The device of claim 10, further comprising:
a reference cell comprising a reference value used in determining a resistance of the memory cell;
a reference bit line connected to the reference cell;
a sixth MOSFET which configured to hold the reference bit line to a reference voltage while reading data;
a seventh MOSFET configured to connect the sense amplifier to a drain of the sixth MOSFET;
an eighth MOSFET configured to connect a source of the sixth MOSFET to the reference bit line;
a ninth MOSFET configured to connect the drain of the sixth MOSFET to a ground terminal; and
a tenth MOSFET configured to connect the source of the sixth MOSFET to a ground terminal,
wherein the seventh and eighth MOSFETs are on and the ninth and tenth MOSFETs are off when the sense amplifier is active, and
the seventh and eighth MOSFETs are off and the ninth and tenth MOSFETs are on when the sense amplifier is inactive.

16. The device of claim 15, wherein a channel area of the sixth MOSFET is larger than a channel area of the seventh MOSFET.

17. The device of claim 15, wherein
the seventh and eighth MOSFETs are simultaneously turned either on or off, and
the ninth and tenth MOSFETs are simultaneously turned either on or off.

18. The device of claim 15, wherein the reference voltage is set based on a control voltage applied to a gate of the sixth MOSFET.

19. The device of claim 15, wherein the sixth MOSFET is configured to function as a stabilizing capacitance when the sense amplifier is inactive.

20. The device of claim 10, wherein the memory cell comprises a fixed layer comprising a fixed direction of magnetization, a recording layer comprising a variable direction of magnetization, and a non-magnetic layer between the fixed layer and the recording layer.

* * * * *